US012684756B2

(12) United States Patent
    Lin

(10) Patent No.:    US 12,684,756 B2
(45) Date of Patent:        Jul. 14, 2026

(54) ACTIVE REGION STRUCTURE AND THE FORMING METHOD THEREOF

(71) Applicant: Fujian Jinhua Integrated Circuit Co., Ltd., Quanzhou City (CN)

(72) Inventor: Gang-Yi Lin, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 667 days.

(21) Appl. No.: 17/874,309

(22) Filed: Jul. 27, 2022

(65) Prior Publication Data

US 2022/0359534 A1      Nov. 10, 2022

Related U.S. Application Data

(63) Continuation-in-part of application No. 17/069,847, filed on Oct. 13, 2020, now Pat. No. 11,482,424.

(30) Foreign Application Priority Data

Sep. 15, 2020    (CN) .......................... 202022016048.5

(51) Int. Cl.
    *H01L 27/108*        (2006.01)
    *H10B 12/00*         (2023.01)
    *H10P 50/00*         (2026.01)

(52) U.S. Cl.
    CPC ............. *H10B 12/09* (2023.02); *H10B 12/50* (2023.02); *H10P 50/73* (2026.01)

(58) Field of Classification Search
    CPC ......... H10B 12/09; H10B 12/50; H10P 50/73; H10P 50/695
    See application file for complete search history.

(56) References Cited

U.S. PATENT DOCUMENTS

| | | |
|---|---|---|
| 9,704,816 B1 | 7/2017 | Huang |
| 2009/0273051 A1 | 11/2009 | Parekh |
| 2013/0328160 A1 | 12/2013 | Ota |
| 2016/0181143 A1* | 6/2016 | Kwon ..................... H10B 12/34 |
| | | 438/586 |

FOREIGN PATENT DOCUMENTS

CN          213026126      *    4/2021

* cited by examiner

*Primary Examiner* — Walter H Swanson
(74) *Attorney, Agent, or Firm* — Winston Hsu

(57)            ABSTRACT

The present invention provides an active region structure, the active region structure includes a plurality of sub-closed conductive patterns located on a substrate, the sub-closed conductive patterns are in contact with each other and form a larger closed pattern, a first boundary of the larger closed pattern extends along a horizontal direction, and a second boundary of the larger closed pattern extends along a vertical direction.

10 Claims, 5 Drawing Sheets

ACTIVE REGION STRUCTURE AND THE FORMING METHOD THEREOF

CROSS REFERENCE TO RELATED APPLICATIONS

This application is a continuation-in-part of U.S. application Ser. No. 17/069,847, filed on Oct. 13, 2020. The content of the application is incorporated herein by reference.

BACKGROUND OF THE INVENTION

1. Field of the Invention

The invention relates to semiconductor technology. More specifically, the present invention relates to an active region structure of a semiconductor and a forming method thereof.

2. Description of the Prior Art

In recent years, electronic products are generally designed with multifunction and fast processing capability. In order to increase the processing capability, a computer system or a multifunctional electronic product, for example, requires a dynamic random access memory (DRAM) with large capacity. For increasing the memory capacity, a size of memory cells of a memory has to be reduced; however, other problems arise therefrom after the size of the memory cells are significantly reduced, which lead to instability or damage to the operation of the memory cells.

In a semiconductor device, an active layer unit is generally defined on a substrate and employed as a base that a required device structure is formed thereon. Thus, as the active layer unit on the substrate is employed as a base of the device, a size, a shape and a position of the device are determined based thereon. The active layer unit is also referred to as a device cell hereinafter.

Taking memory cells of a memory as an example, a plurality of memory cells are regularly arranged in a predetermined device region to form an array. A device cell eventually forms a memory cell. Moreover, for the memory cells capable of being operated, some peripheral circuits are provided in the periphery of the memory cells to control the memory cells. The peripheral circuits are also formed based on a peripheral active region.

Therefore, under the need of dramatically reducing the dimension of the semiconductor device, how to design the device structure for maintaining them in normal operation is one of the subjects to be considered.

SUMMARY OF THE INVENTION

The invention provides an active region structure and a forming method thereof, at least capable of preventing the semiconductor device from being damaged resulted from stress generated by a shallow trench isolation (STI) structure in a periphery of a semiconductor device when a dimension of the semiconductor device is reduced.

The present invention provides a method of forming an active region structure, the method includes: a plurality of sacrificial patterns is formed above a substrate, at least part of the sacrificial patterns includes a horizontal portion and a vertical portion, the horizontal portion of at least part of the sacrificial patterns and the horizontal portion of another adjacent sacrificial pattern are aligned with each other in a horizontal direction, and a plurality of spacer patterns are formed, and each spacer pattern surrounds a sacrificial pattern.

In some embodiments of the present invention, each of the spacer patterns is a closed pattern when viewed from a top view.

In some embodiments of the present invention, the plurality of spacer patterns are in contact with each other and form a larger closed pattern.

In some embodiments of the present invention, the larger closed pattern comprises a closed edge portion, and a plurality of inclined portions are located in the area inside the closed edge portion.

In some embodiments of the present invention, the inclined portions are arranged along a first direction, wherein the first direction is different from the horizontal direction or the vertical direction.

In some embodiments of the present invention, each closed edge portion includes a plurality of boundaries, wherein at least one of the boundaries extends along the horizontal direction and at least one of the boundaries extends along the vertical direction.

In some embodiments of the present invention, a first etching step is further performed to remove the plurality of sacrificial patterns after forming the plurality of spacer patterns.

In some embodiments of the present invention, a material layer is further performed between the substrate and the plurality of spacer patterns.

In some embodiments of the present invention, a second etching step is further performed to transfer the spacer patterns into the material layer with the spacer patterns as a mask.

The present invention provides an active region structure, the active region structure includes a plurality of sub-closed conductive patterns located on a substrate, wherein the sub-closed conductive patterns are in contact with each other and form a larger closed pattern, wherein a first boundary of the larger closed pattern extends along a horizontal direction, and a second boundary of the larger closed pattern extends along a vertical direction.

In some embodiments of the present invention, further comprising a plurality of inclined portions located in the larger closed pattern, wherein the inclined portions do not contact the larger closed pattern, wherein the inclined portions are arranged along a first direction, wherein the first direction is different from the horizontal direction or the vertical direction.

In some embodiments of the present invention, the larger closed pattern includes the first boundary, the second boundary and a third boundary extending along the first direction.

In some embodiments of the present invention, at least one sub-closed conductive pattern includes an irregular polygon with more than six corners.

In some embodiments of the present invention, the larger closed patterns have different widths, wherein the maximum width is greater than 1.3 times and not greater than 2 times a width of a short side of the inclined portion.

The present invention provides an active region structure, the active region structure includes a sub-closed conductive pattern located on a substrate, wherein the sub-closed conductive pattern includes a closed edge portion, and a plurality of inclined portions located in the area inside the closed edge portion, the inclined portions are arranged along a first direction, and at least one branch contacting a closed edge portion of the sub-closed conductive pattern and extending inwardly to the sub-closed conductive pattern, the branch includes a first part and a second part, wherein the first part is arranged along the first direction and the second part is arranged along a second direction different from the first direction.

In some embodiments of the present invention, at least one smaller closed pattern is further included in the closed edge portion.

In some embodiments of the present invention, a first boundary of the sub-closed conductive pattern extends along a horizontal direction, a second boundary of the sub-closed conductive pattern extends along a vertical direction, and a third boundary of the sub-closed conductive pattern extends along the first direction.

In some embodiments of the present invention, the closed edge portion has different widths, and the maximum width is located at the intersection point of the branch and the closed edge portion.

In some embodiments of the present invention, a lengths of the first part of the branch and a length of the second part of the branch are different.

In some embodiments of the present invention, a length of the branch arranged along the first direction is 2-8 times a length of the branch arranged along the second direction.

To sum up, the invention discloses an active region structure and a manufacturing method thereof, which also comprises a edge portion around the active region, so that the stress generated by the shallow trench insulation layer in the peripheral area on the active region can be blocked, and the component unit in the peripheral area of the active region can be prevented from being damaged due to stress. In addition, the closed edge portion includes branches extending into the active region, and the branches extend in at least two different directions, which can compensate the uneven stress at the end between the active lines and avoid the damage of the component unit.

These and other objectives of the present invention will no doubt become obvious to those of ordinary skill in the art after reading the following detailed description of the preferred embodiment that is illustrated in the various figures and drawings.

DETAILED DESCRIPTION

Semiconductor devices, e.g., memory cells, have to be isolated to achieve an insulation effect. As an insulation structure requires high device density, a method that a shallow trench isolation (STI) layer, for example, is formed between device cells and between the device cells and a peripheral active region is required, so as to provide an insulation effect between the devices.

As insulation quality between the devices is considered in the invention, a corresponding design is provided.

A material of the STI layer includes a dielectric material, and the device cells and the peripheral active region are formed by a portion of a substrate, such as a surface portion of a silicon substrate, which are formed after being patterned. Furthermore, a distance between each of the device cells and the peripheral active region is greater than a gap between each of the device cells and occupies a greater area, thereby generating greater stress. As a result, the material of the STI layer causes unbalanced stress to a peripheral region of the device cells and easily damages some of the device cells in the periphery. The invention provides an efficient design for forming the device cells, which can contribute to mitigating the stress effect caused by the STI layer to the device cells and preventing the device cells from being damaged.

Several embodiments are provided below for describing the invention; however, the invention is not limited by the embodiments provided below.

Figure 1:
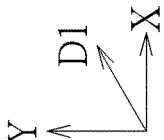
FIG. 1 is a schematic top view of an active region structure according to an embodiment of the present invention.

FIG. 1 is a schematic top view of an active region structure according to an embodiment of the invention. Referring to FIG. 1, an overall semiconductor structure of an apparatus, by taking a memory apparatus 90 as an example, includes an active region 100, a peripheral active region 110 and an insulation layer (STI layer) 108 therebetween for insulating them from each other. The active region 100 is a region for forming high-density devices. Taking the memory apparatus 90 for example, the active region 100 is a region for forming a memory cell array. The active region 100 includes a device region 102. A plurality of device cells (inclined portions) 104 are predicted to be formed within the device region 102 to serve as a basis for a device structure to be fabricated. Namely, the region of the array formed by the device cells 104 is also referred to as the device region 102 hereinafter.

The active region 100 also includes an edge portion 106 in an outer periphery of the device region 102. In one of the provided embodiments, the edge portion 106 continuously surrounds the device region 102, for example.

The device cells and the edge portion 106 are formed in a process of patterning the surface of the substrate. The substrate is, for example, a silicon substrate. The device cell 104 and the edge portion 106 hereinafter are collectively referred to as an active layer 150 having the plurality of device cells 104 within the device region 102 and the edge portion 106 surrounding the device region 102.

The edge portion 106 of the invention has at least one branch 107 a extending into the device region 102 and is between a portion of the device cells 104. The number of the at least one branch 107 is generally plural.

The active region 100 also includes the STI layer 108 used to insulate the device cells 104 from one another and relatively isolate the device cells 104 from peripheral active region 110. It can be understood herein that the STI layer 108 included in the active region 100 is a portion of the overall structure. The STI layer 108 actually extends to the peripheral active region 100 and also provides the insulation effect for the peripheral active region 110.

In a preferred structure of an embodiment, the STI layer 108 has a first part 108a and a second part 108b. The first part 108a is formed within the edge portion 106 to insulate the device cells 104 from one another. The second part 108b surrounds the edge portion 106. Namely, the second part 108b of the STI layer 108 isolates the device cells 104 from the peripheral active region 110.

The peripheral active region 100 is used for forming a peripheral circuit device and is also formed by patterning the surface of the substrate. Taking the memory apparatus 90 for example, the peripheral active region 100 is used for forming a peripheral circuit to control operations of the memory cells, such as data storage, reading and deleting. Additionally, a position for a subsequently formed memory cell structure corresponds to the device cells 104 and is based on the device structure of the device cell 104.

It should be mentioned that a distance D is between the edge portion 106 and the peripheral active region 110. The distance D in a general scenario is greater than a gap between each of the device cells 104. Thus, the second part 108*b* of the STI layer 108 has greater stress with respect to the first part 108*a* between the edge portion 106 and the peripheral active region 110. However, the edge portion 106 of the invention can block the stress generated by the second part 108*b* of the STI layer 108.

A further effect is that the branches 107 extend into the device region 102 of the device cells 104, such that stress in the periphery of the device region 102 is uniform. Furthermore, each of the device cells 104 has a strip shape, i.e., a strip structure and has a longitudinal direction. Thus, the device cells are aligned to one another in the longitudinal direction to form a plurality of active lines. A direction of the active lines is, for example, inclined relatively to a side of the device region 102. Each of the active lines includes multiple of the device cells 104. However, positions of the device cells on two adjacent active lines are not in consistency, but arranged in alternation. Thus, end parts of the active lines are not all neatly fall within the periphery of the device region 102 according to the positions of the device cells 104, and the end parts of some of the active lines are recessed into the device region 102. In terms of the phenomenon of the active lines, the recessed-in active lines would cause unbalanced stress to the end parts of two adjacent active lines. However, each of the branches 107 of the edge portion 106 is aligned to one of the active lines and located between two adjacent active lines. Thus, resulted from the effect of the branches 107, the periphery of the device region 102 has a more uniform stress distribution to achieve stress balance, thereby, mitigating the damage caused by the device cells 104 in the periphery of the device region 102.

In this case, a line width of each branch 107 is, for example, consistent with that of each active line, so as to obtain better stress balance. Additionally, notches 112 may also be formed in the outer periphery of the edge portion 106, for example. An amount, a depth and a width of the notches 112 may be determined based on actual demands. In the presence of a mechanical effect of the notches 112, strength of the edge portion 106 can be increased, so as to block the stress generated by the STI layer 108 in the outer periphery.

Furthermore, the branches 107 may extend in different directions, respectively. For example, the branch 107 may include a first part 107*a* arranged along the first direction D1 and a second part 107*b* arranged along the second direction (X direction or Y direction). The first direction D1 is same as the arrangement direction of each device cell (inclined portion) 104. That is to say, a plurality of device cells 104 are arranged along the oblique direction (first direction D1), and the first part 107*a* of the branch 107 is also arranged in the first direction D1, but the second part 107*b* of the branch 107 is arranged in a second direction different from the first direction D1. In addition, the first direction D1 in this embodiment is different from the horizontal direction (e.g., X direction) or the vertical direction (e.g., Y direction).

According to the mechanism of the edge portion 106 of the invention, the edge portion 106 is not limited to continuously surrounding the device region 102 as set forth in the above embodiment. The edge portion 106 may also partially surrounds the device region 102 in correspondence to the peripheral active region 110. Thus, the edge portion 106 may partially surround the device region 102. However, based on actual circuit scheme, the peripheral active regions

110 are provided in the periphery of the device region 102 for various kinds of circuits. Thus, in the present embodiment, the edge portion 106 may be plural, and the plurality of edge portions 106 are not directly connected. Taking the device region 102 in a quadrilateral shape for example, it may be discontinuously surrounded by four edge portions 106.

FIG. 2 to FIG. 7 are schematic top views of the process of manufacturing the active region structure shown in FIG. 1. For the sake of brevity, FIGS. 2-7 only show the structure in the device region 102, and omit other surrounding components (such as the peripheral active region 110).

Figure 2:
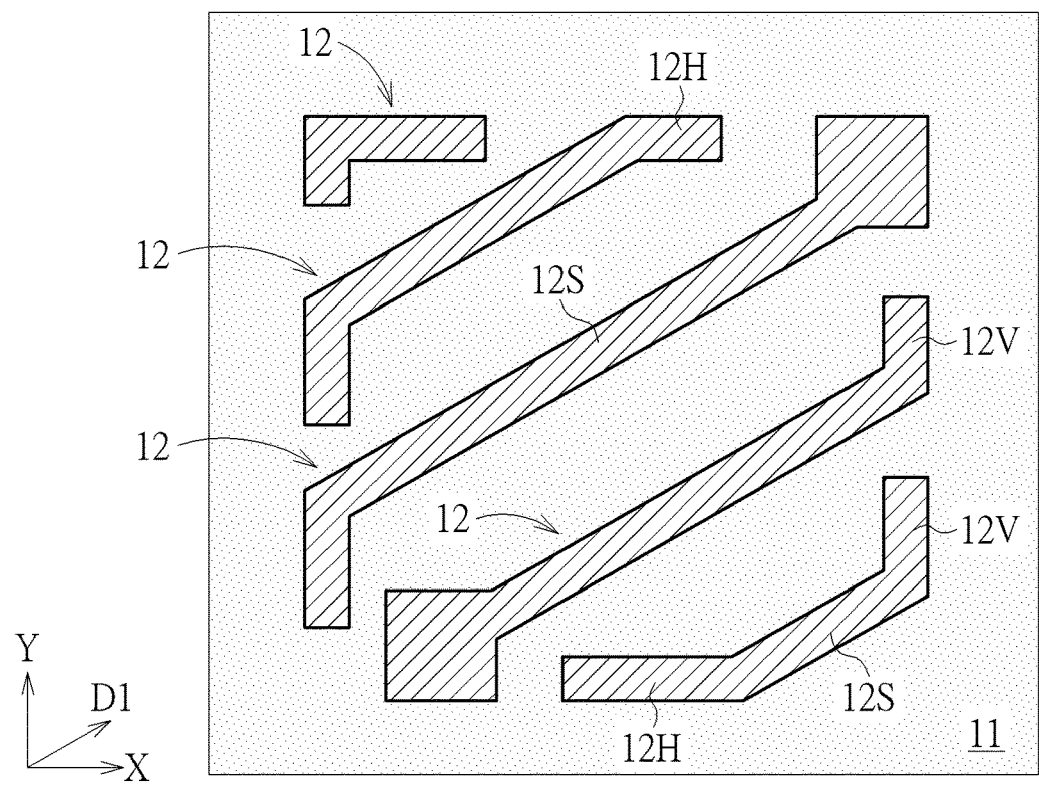
FIG. 2 to FIG. 7 are schematic top views of the process of fabricating the active region structure shown in FIG. 1.

As shown in FIG. 2, a material layer 11 is formed on a substrate (not shown), the substrate may include a single layer or a composite layer structure, such as a silicon substrate or a multilayer stacked structure composed of a silicon substrate, an oxide layer, an amorphous silicon layer and other multilayer materials. The material layer 11 may be an insulating layer, such as a silicon nitride layer on the substrate. Then, a plurality of first sacrificial patterns 12 are formed on the material layer 11, wherein at least part of the first sacrificial patterns 12 includes a horizontal portion 12H and a vertical portion 12V, and a plurality of inclined portions 12S are located between the horizontal portion 12H and the vertical portion 12V, wherein the inclined portions 12S are arranged along the first direction D 1. In addition, at least part of the horizontal portion 12H of the first sacrificial pattern 12 and the adjacent horizontal portion 12H of another sacrificial pattern 12 are aligned with each other in a horizontal direction (e.g., X direction), and at least part of the vertical portion 12V of the sacrificial pattern 12 and the adjacent vertical portion 12V of another sacrificial pattern 12 are aligned with each other in a vertical direction (e.g., Y direction). In this embodiment, the material of the first sacrificial pattern 12 is, but not limited to, an organic dielectric layer (ODL).

Figure 3:
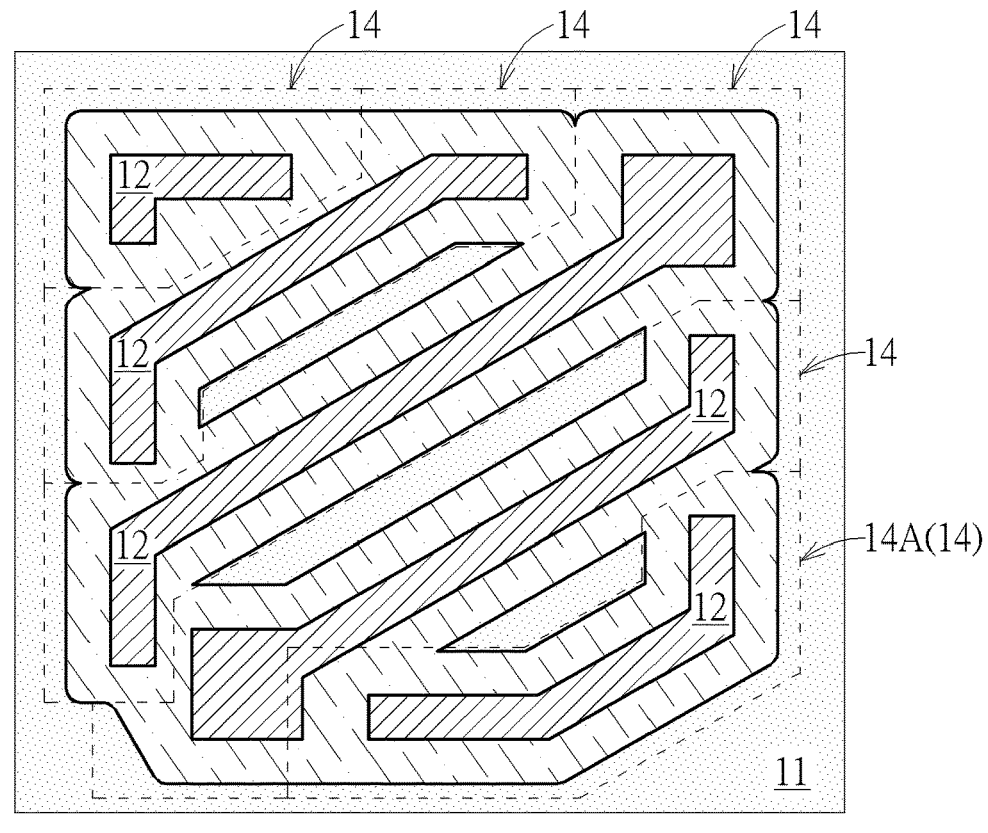

As shown in FIG. 3, a plurality of spacer patterns 14 are formed around each first sacrificial pattern 12. The method for forming a plurality of spacer patterns 14 may include a deposition step and an etch-back step to form the spacer pattern 14 surrounding each first sacrificial pattern 12. The material of the spacer pattern 14 can be selected from materials different from those of the first sacrificial pattern 12 and the material layer 11, such as silicon oxide or silicon oxynitride, but not limited to this.

Figure 4:
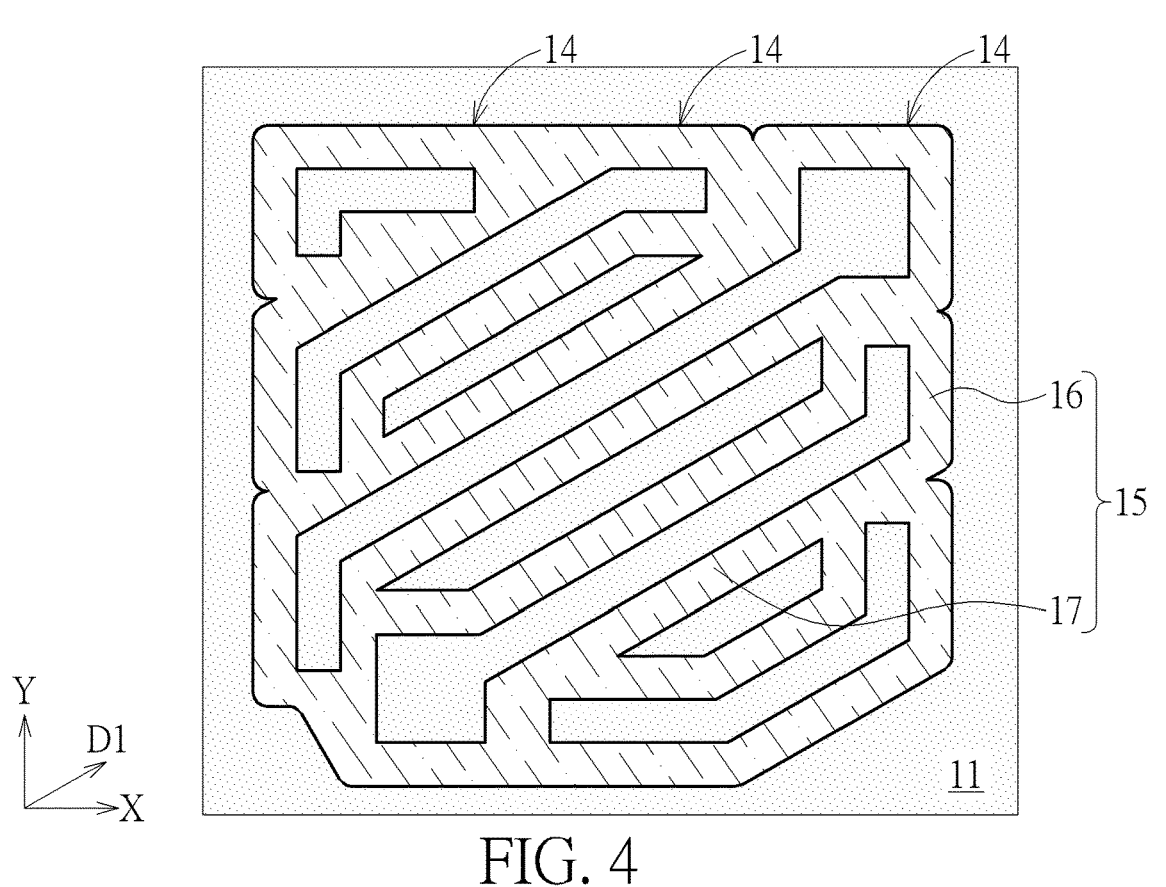

As shown in FIG. 4, the first sacrificial pattern 12 is removed by etching steps or the like, thus leaving a plurality of spacer patterns 14 on the material layer 11. It is worth noting that, as mentioned above in FIG. 3, the spacer pattern 14 is formed surrounding the first sacrificial pattern 12, so each spacer pattern 14 should be a closed pattern. That is to say, when viewed from the center of each spacer pattern 14, each side outward is surrounded by the spacer pattern without a gap.

In addition, in this embodiment, the distance between the first sacrificial patterns 12 shown in FIG. 2 is small, so that after the spacer patterns 14 are formed, the spacer patterns 14 are connected with each other, to form a larger closed pattern 15. As shown in FIG. 4, the larger closed pattern 15 is composed of a plurality of closed spacer patterns 14 connected with each other. Furthermore, as shown in FIG. 4, the larger closed pattern 15 includes a closed edge portion 16 and a plurality of inclined portions 17, wherein at least one boundary of the closed edge portion 16 extends along a horizontal direction (e.g., X direction), at least the other boundary of the closed portion 16 extends along a vertical direction (e.g., Y direction), and a plurality of inclined portions 17 extend along the first direction D1.

Figure 5:
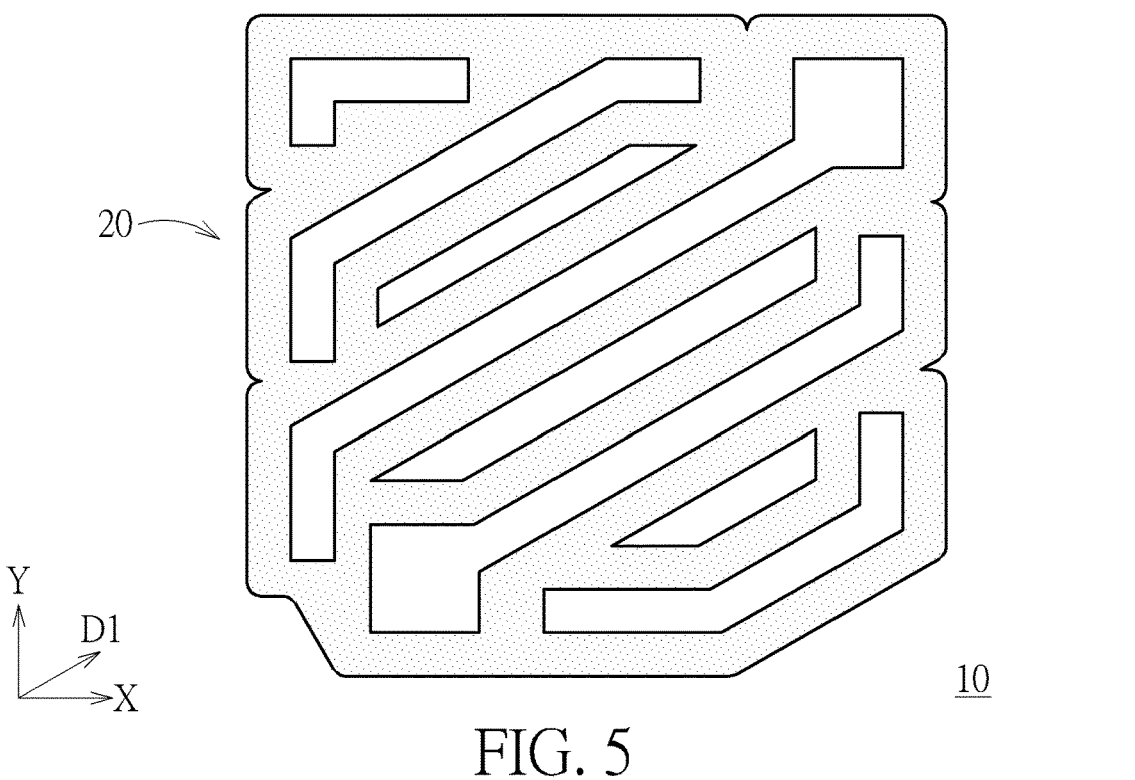

As shown in FIG. 5, a larger closed pattern 15 (including the closed edge portion 16 and the inclined portions 17) is transferred into the underlying material layer 11 by means of an etching step. A mask pattern 20 is formed in the material layer 11. The mask pattern 20 is located on the substrate 10. When the substrate 10 is a single layer, the mask pattern 20 is directly located on the substrate 10, that is, the substrate 10 is exposed. In another case, when the substrate 10 is a multi-layer structure, the mask pattern 20 may be located on other material layers (not shown). Since the mask pattern 20 is formed by etching the material layer 11, the materials of the mask pattern 20 is the same the material of the material layer 11 (for example, the mask pattern 20 also contains silicon nitride).

Figure 6:
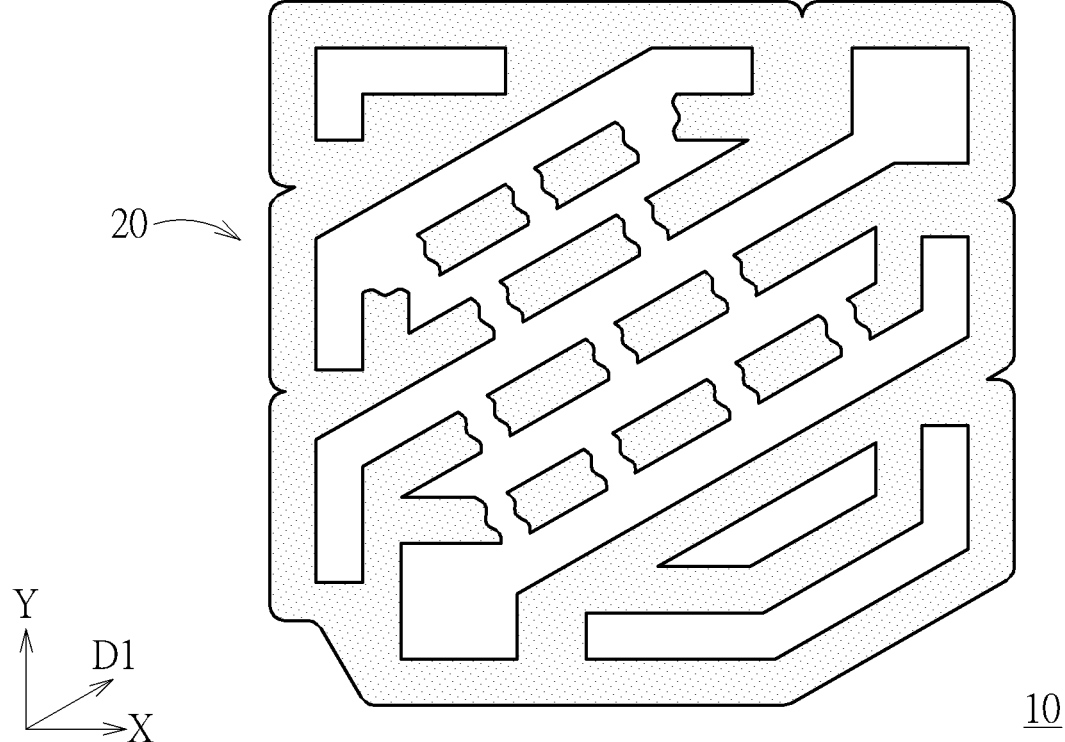
Figure 7:
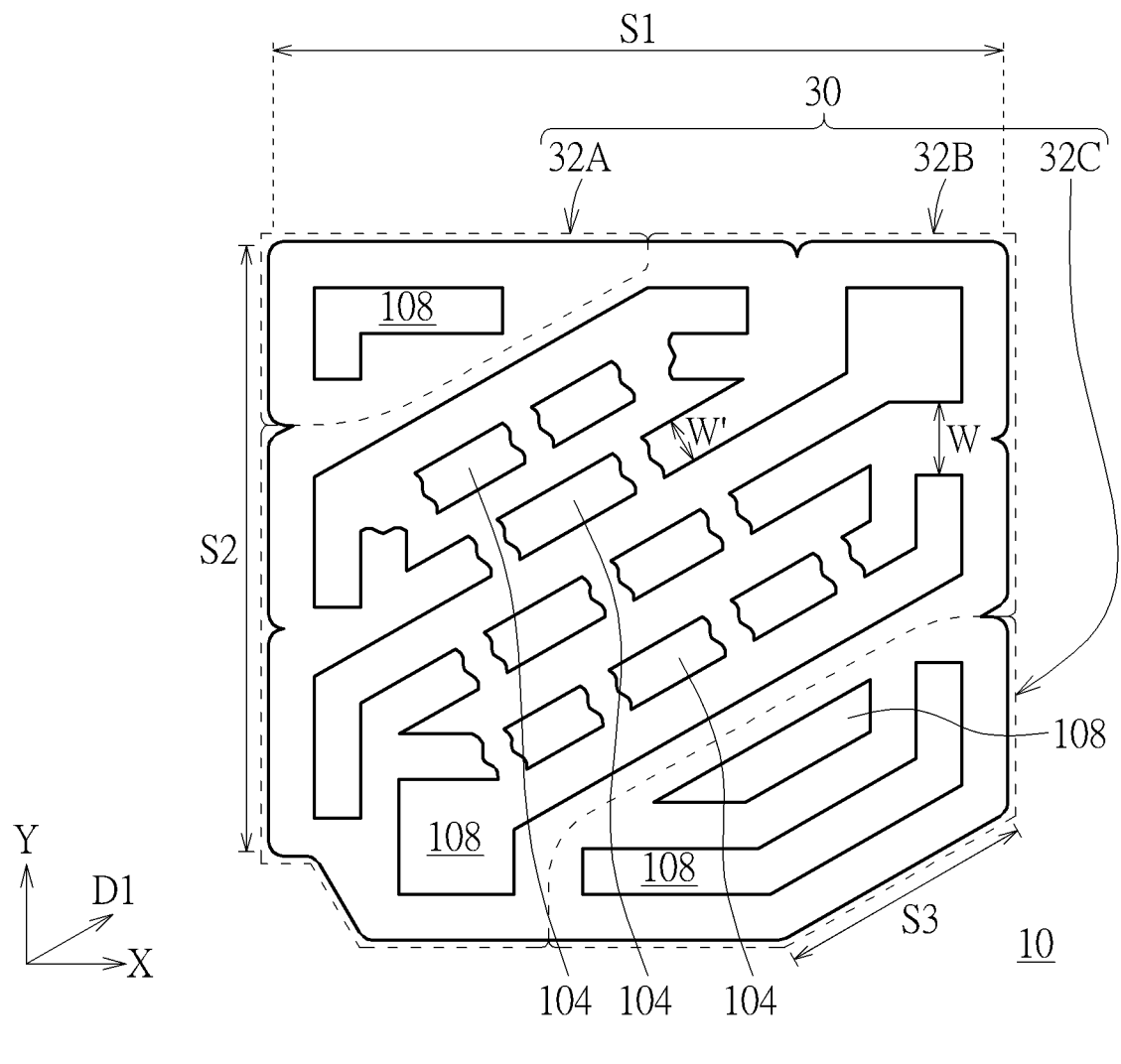

As shown in FIG. 6, a patterning step is performed to partially remove the mask pattern 20, especially remove parts of the inclined portions 17, and divide each original inclined portion 17 into a plurality of spaced segmented structures, each segmented structure corresponds to the device cell (inclined portion) 104 of the active region 100 to be formed later. That is, taking the remaining mask pattern 20 in FIG. 6 as another mask layer and transferring the pattern to the underlying substrate 10. Next, an insulating layer (STI) is formed on the substrate 10. As shown in FIG. 7, the remaining patterns include an active area pattern 30 (it is same as the active layer 150 shown in FIG. 1) made of the same material as the substrate 10, and an insulation layer (e.g., the STI layer) 108 around the active area pattern 30.

As shown in FIG. 7, the active area pattern 30 of the present invention has a special shape. Specifically, the active area pattern 30 can also be defined as a larger closed pattern 30 (that is, the active layer 150 shown in FIG. 1), the large closed pattern 30 can be divided into a plurality of small parts. They are respectively sub-closed conductive pattern 32A, sub-closed conductive pattern 32B and sub-closed conductive pattern 32C, where the sub-closed conductive pattern 32A, the sub-closed conductive pattern 32B and the sub-closed conductive pattern 32C are in contact with each other and combined into the larger closed pattern 30. In this embodiment, the sub-closed conductive pattern 32B includes a plurality of device cell (i.e., the inclined portion 104 shown in FIG. 1 and FIG. 7), in other words, the subsequent elements are mainly formed in the range of the sub-closed conductive pattern 32B. However, the sub-closed conductive pattern 32A and the sub-closed conductive pattern 32C do not contain the device cell (inclined portion 104).

Besides, in the present embodiment, at least one boundary (edge) of each sub-closed conductive pattern overlaps at least one boundary (edge) of the larger closed pattern. For example, as shown in FIG. 7, the larger closed pattern 30 has a first boundary S1, a second boundary S2 and a third boundary, and the boundaries (edges) of the sub-closed conductive pattern 32A overlap the first boundary S1 and the second boundary S2 of the larger closed pattern 30. Similarly, the boundaries (edges) of the sub-closed conductive pattern 32B overlap the first boundary S1 and the second boundary S2 of the larger closed pattern 30, and the boundary (edge) of the sub-closed conductive pattern 32C overlaps the third boundary S3 of the larger closed pattern 30. Therefore, in the present embodiment, since the edge of the device cell (inclined portion 104) does not overlap with the boundary of the larger closed pattern 30, so each device cell (inclined portion 104) cannot be deemed as the sub-closed conductive pattern.

It is worth noting that in this embodiment, as shown in FIG. 7, each sub-closed conductive pattern may have an irregular shape, for example, the sub-closed conductive pattern 32A has a triangular shape, the active area pattern 30 of the sub-closed conductive pattern 32A surrounds the central insulation layer (the STI layer) 108, while the sub-closed conductive pattern 32C has a polygonal shape, and the active area pattern 30 of the sub-closed conductive pattern 32C also surrounds the central insulation layer 108. In addition, since the sub-closed conductive pattern 32A and the sub-closed conductive pattern 32C do not contain the device cell, the sub-closed conductive pattern 32A and sub-closed conductive pattern 32C are regarded as dummy closed patterns. As shown in FIG. 1, the device cell (inclined portion 104) described here means the active area pattern 30 surrounded by the insulation layer 108. And the terms "closed conductive pattern" means the active area pattern 30 completely surrounds the structure of the STI layer 108.

The sub-closed conductive pattern 32A and sub-closed conductive pattern 32C formed in this embodiment can protect the sub-closed conductive pattern 32B. More specifically, both the sub-closed conductive pattern 32A and the sub-closed conductive pattern 32C have a closed structure, that is, the insulation layer (STI layer) 108 is surrounded by the active area pattern 30. The closed structure has a function similar to the dummy structure, which are formed next to the sub-closed conductive pattern 32B. When the etching step is carried out, it can protect the sub-closed conductive pattern 32B from over-etching, thus improving the process yield.

In addition, the pattern of the present invention has the following characteristics (please refer to FIGS. 1-7 together):

As shown in FIG. 1 and FIG. 7, the closed pattern 30 (i.e. the active layer 150) has a first boundary S1 extending along the horizontal direction (X direction), a second boundary S2 extending along the vertical direction (Y direction), and a third boundary S3 extending along the first direction D1.

As shown in FIG. 1, the edge portions of the closed pattern (i.e. the active layer 150) have different widths, and the largest width is labeled as W, which is located at the intersection point of the branch 107 and the edge portion 106.

As shown in FIG. 1, the closed pattern (i.e. the active layer 150) has different widths, wherein the maximum width W is greater than 1.3 times and not greater than 2 times the short side width W′ of the device cell (inclined portion) 104.

As shown in FIG. 1, the length of the first part 107a of the branch 107 (labeled as L1) is different from the length of the second part 107b (labeled as L2). The length of the branches 107 arranged along the first direction D1, i.e., the length of the first part 107a is 2-8 times larger than the length of the second part 107b of the branches 107 arranged along the second direction (e.g., the Y direction).

As shown in FIG. 1 and FIG. 7, an active region structure is provided, the active region structure includes a plurality of sub-closed conductive patterns (32A, 32B, 32C) located on a substrate 10, the sub-closed conductive patterns are in contact with each other and form a larger closed pattern 30, a first boundary S1 of the larger closed pattern 30 extends along a horizontal direction, and a second boundary S2 of the larger closed pattern extends along a vertical direction.

As shown in FIG. 1 and FIG. 7, further comprising a plurality of inclined portions 104 located in the larger closed pattern 30, the inclined portions do not contact the larger closed pattern 30, the inclined portions are arranged along a first direction D1, the first direction D1 is different from the horizontal direction or the vertical direction.

As shown in FIG. 1 and FIG. 7, the larger closed pattern 30 comprises the first boundary S1, the second boundary S2 and a third boundary S3 extending along the first direction.

As shown in FIG. 1 and FIG. 7, at least one sub-closed conductive pattern 32C comprises an irregular polygon with more than six corners.

As shown in FIG. 1 and FIG. 7, the larger closed pattern 30 have different widths, wherein the maximum width W is greater than 1.3 times and not greater than 2 times a width W' of a short side of the inclined portion.

To sum up, the invention discloses an active region structure and a manufacturing method thereof, which also comprises a edge portion around the active region, so that the stress generated by the shallow trench insulation layer in the peripheral area on the active region can be blocked, and the component unit in the peripheral area of the active region can be prevented from being damaged due to stress. In addition, the closed edge portion includes branches extending into the active region, and the branches extend in at least two different directions, which can compensate the uneven stress at the end between the active lines and avoid the damage of the component unit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an active region structure, comprising:

forming a plurality of device cells arranged along a first direction to form a plurality of active lines;

forming an active boundary structure surrounding the plurality of active lines;

forming a branch structure connected to the active boundary structure, wherein the branch structure comprises: a first part extending along the first direction; and a second part directly contacting the first part and extending along a second direction, wherein the second direction is different from the first direction; and forming a shallow trench insulation layer disposed between the plurality of device cells and the active boundary structure.

2. The method according to claim 1, wherein the active boundary structure comprises an irregular polygon with at least six corners.

3. The method according to claim 1, wherein the active boundary structure comprise at least one closed pattern.

4. The method according to claim 3, wherein the active boundary structure comprises a first boundary, a second boundary and a third boundary extending along the first direction contact with each other and form a larger closed pattern.

5. The method according to claim 3, wherein the active boundary structure continuously surrounds the plurality of active lines.

6. An active region structure, comprising:

a plurality of device cells arranged along a first direction to form a plurality of active lines;

an active boundary structure surrounding the plurality of active lines;

a branch structure connected to the active boundary structure, wherein the branch structure comprises: a first part extending along the first direction; and a second part directly contacting the first part and extending along a second direction, wherein the second direction is different from the first direction; and a shallow trench insulation layer disposed between the plurality of device cells and the active boundary structure.

7. The active region structure according to claim 6, wherein the active boundary structure comprises an irregular polygon with at least six corners.

8. The active region structure according to claim 6, wherein the active boundary structure comprises at least one closed pattern.

9. The active region structure according to claim 8, wherein the active boundary structure comprises a first boundary, a second boundary and a third boundary extending along the first direction.

10. The active region structure according to claim 8, wherein the active boundary structure continuously surrounds the plurality of active lines.

*     *     *     *     *